(12) United States Patent
Hobara (10) Patent No.: US 7,293,208 B2
(45) Date of Patent: Nov. 6, 2007

(54) TEST METHOD FOR NONVOLATILE MEMORY

(75) Inventor: Tetsuya Hobara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 239 days.

(21) Appl. No.: 11/081,636

(22) Filed: Mar. 17, 2005

(65) Prior Publication Data
US 2006/0048023 A1    Mar. 2, 2006

(30) Foreign Application Priority Data
Aug. 27, 2004   (JP)   ............................. 2004-247749

(51) Int. Cl.
*G11C 29/00* (2006.01)
(52) U.S. Cl. ...................... 714/718; 365/201
(58) Field of Classification Search .................. None
See application file for complete search history.

(56) References Cited

U.S. PATENT DOCUMENTS 5,561,628 A * 10/1996 Terada et al. .......... 365/185.04
6,011,720 A * 1/2000 Tanaka ................... 365/185.22
6,085,281 A * 7/2000 Kopp et al. .................. 711/103
6,219,289 B1 * 4/2001 Satoh et al. ................. 365/201

FOREIGN PATENT DOCUMENTS

JP    2000-040389    2/2000

* cited by examiner

*Primary Examiner*—Guy Lamarre
*Assistant Examiner*—John J. Tabone, Jr.
(74) *Attorney, Agent, or Firm*—Rabin & Berdo, P.C.

(57) ABSTRACT

A control terminal section CON and an address terminal section ADDR of a test apparatus are respectively connected to those of a flash memory. A first to an (n−1)-th input and output terminal of the test apparatus are connected to data terminals of the flash memory. Further, an n-th and an (n+1)-th input and output terminal of the test apparatus are connected to a multifunctional terminal of the flash memory. The (n+1)-th input and output terminal is established as a dedicated terminal to receive data supplied to the test apparatus. The first to the n-th input and output terminal of the test apparatus are used to output the writing data to the flash memory, while the (n+1)-th input and output terminal is used to detect the completion signal output from the flash memory.

21 Claims, 4 Drawing Sheets

TEST METHOD FOR NONVOLATILE MEMORY

BACKGROUND OF THE INVENTION

1. Field of the Invention

The invention relates to a method for testing a nonvolatile memory such as a flash memory which outputs a completion signal upon completion of a writing operation or an erasing operation in the memory.

2. Description of the Related Art

A flash memory employs a field-effect transistor with a floating gate as a memory device to write and erase data by accumulating an electrical charge to the floating gate and by discharging the accumulated electrical charge from the floating gate. Since the electrical charge in the insulated floating gate is retained even after a power source is disconnected, the flash memory is referred to as a nonvolatile memory. One example of the flash memory is disclosed in Japanese Patent Kokai No. 2000-40389.

The flash memory includes a control circuit which performs page-by-page writing of the data, e.g. 512 bytes in one page, and block-by-block erasing of the data, e.g. 32 pages in one block. Due to property inherent in the memory device, it is impossible to perform a high speed rewriting operation that is realized by a memory with a flip-flop. Accordingly, the writing data in one page is once stored in a buffer of the control circuit, and then the data is written to a "page" in a memory cell. Until the writing operation to the page is completed, not only a writing operation to the next page but also a data transfer operation to the buffer is prohibited.

Figure 2A:
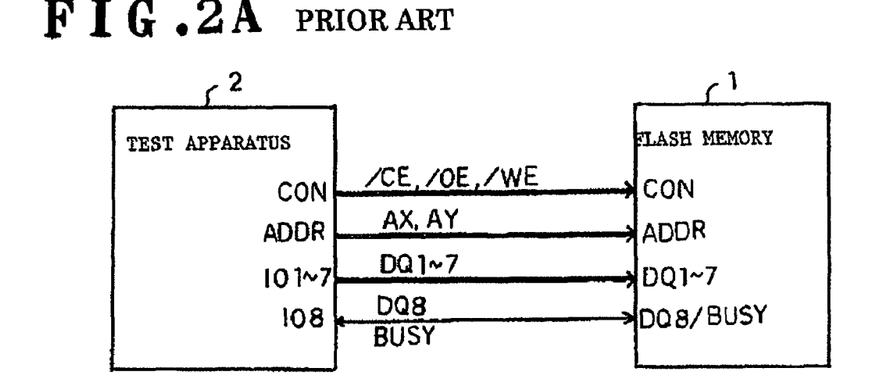
FIG. 2A is a schematic block diagram illustrating a conventional test method for the flash memory.
Figure 2B:
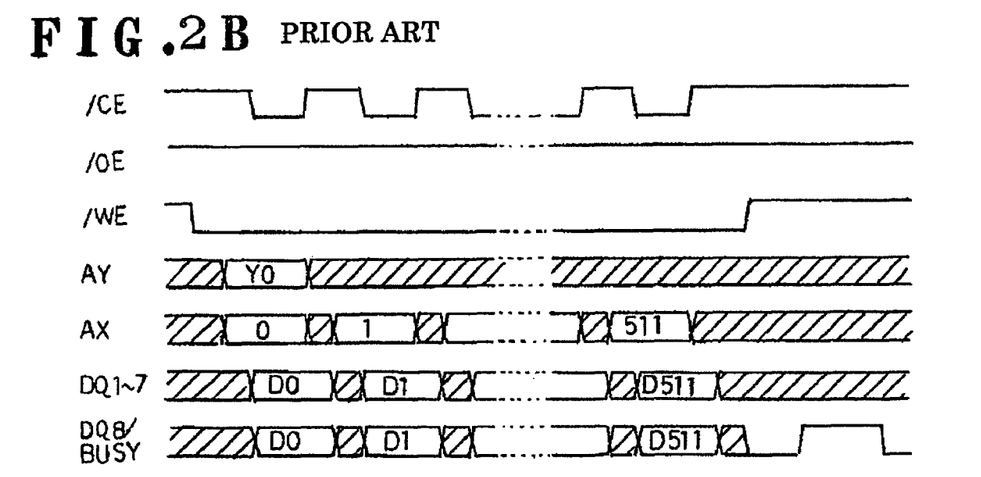
FIG. 2B is a signal waveform chart illustrating the conventional test method for the flash memory.

FIGS. 2A and 2B of the accompanying drawing illustrate a conventional test method for a flash memory. Specifically, FIG. 2A is a diagram illustrating the test method, and FIG. 2B is a signal waveform chart during a writing test.

As shown in FIG. 2A, a flash memory 1 to be tested includes a control terminal section CON, an address terminal section ADDR, bidirectional data terminals DQ1-DQ7, and a multifunctional terminal DQ8/BUSY. The control terminal section CON has a plurality of terminals for receiving control signals such as a chip selection signal /CE, an output control signal /OE, and a writing control signal /WE, where '/' denotes an inversion logic. The address terminal section ADDR has a plurality of terminals. The number of the terminals corresponds to the number of bits of address signals, which respectively designate addresses in a memory area such that whole memory area is covered by the address signals. In this instance, a block number and a page number are designated by a higher address signal AY, while an address within the page is designated by a lower address signal AX.

When one address is composed of 8 bits (1 byte) data, the bidirectional data terminals DQ1-DQ7 receive and supply data corresponding to the first through the seventh bits. The multifunctional terminal DQ8/BUSY sequentially receives writing data corresponding to the eighth bit during the data writing operation. After the completion of the receiving the whole writing data in one page, the multifunctional terminal DQ8/BUSY supplies a busy signal BUSY indicating a state of non-receiving the next writing data until the completion of the writing operation to actual memory cells.

On the other hand, a test apparatus 2 includes not only the control terminal section CON and the address terminal section ADDR which are similar to those of the flash memory 1, but also a plurality of multipurpose input and output terminals IOi (i=1 to n). The control terminal section CON outputs the control signals such as the chip selection signal /CE, the output control signal /OE and the writing control signal /WE, while the address terminal section ADDR outputs the address signals AX and AY. These control signals and address signals are supplied to the flash memory 1 in accordance with a test program incorporated in the test apparatus 2. It should be noted that the control terminal section CON and the address terminal section ADDR may be configured by the multipurpose input and output terminals IOi.

The input and output terminals IOi can be switched to be either input terminals or output terminals in accordance with the test program incorporated in the test apparatus 2. When the input and output terminal IOi of the test apparatus 2 is used as input terminals for receiving data from the flash memory 1, the input and output terminal IOi establishes a strobe condition such as a load timing of the data or a rise or a fall timing of the input signal.

The control terminal section CON and the address terminal section ADDR of the test apparatus 2 are respectively connected to those of the flash memory 1 via a test device provided therebetween. The input and output terminals IO1-IO7 of the test apparatus 2 are respectively connected to the data terminals DQ1-DQ7 of the flash memory 1. The input and output terminal IO8 of the test apparatus 2 is connected to the multifunctional terminal DQ8/BUSY of the flash memory 1.

A test operation will be hereinafter described.

As shown in FIG. 2B, as soon as a writing test is started, a write control signal /WE from the test apparatus 2 shifts from an 'H' level to an 'L' level. The 'L' level of write control signal /WE remains until the whole writing data in one page is output. On the other hand, the output control signal /OE to the flash memory 1 is always kept at an 'H' level. The input and output terminals IO1-IO8 of the test apparatus 2 are designated as output modes.

An address of the data to be written is then designated by the address signals AX and AY from the test apparatus 2. In this instance, a block number and a page number are designated by the address signal AY, while a top address, i.e., Address 0, of the page concerned is designated by the address signal AX.

Subsequent to the outputting of the address signals AX and AY, writing data D0 to be written into this address (that is AX=0) is output from the input and output terminals IO1-IO8 of the test apparatus 2. At the same time, the chip selection signal /CE from the test apparatus 2 shifts from an 'H' level to an 'L' level. Accordingly, the writing data D0 is introduced into the buffer within the flash memory 1.

When a predetermined time period elapses, the outputting of the address signals AX and AY is stopped, and the chip selection signal /CE shifts from the 'L' level to the 'H' level.

The address signal AX then designates the next address, i.e., Address 1. Subsequent to the outputting of the address signal AX, writing data D1 to be written into this address is output from the input and output terminals IO1-IO8 of the test apparatus 2. At the same time, the chip selection signal /CE from the test apparatus 2 shifts from the 'H' level to the 'L' level. Accordingly, the writing data D1 is introduced into the buffer within the flash memory 1. When a predetermined time period elapses, the outputting of the address signal AX is stopped, and the chip selection signal /CE shifts from the 'L' level to the 'H' level.

In a similar manner as describe above, the writing data are sequentially output up to the last address of the page concerned, i.e., Address 511.

The write control signal /WE from the test apparatus 2 then shifts to the 'H' level. The input and output terminal IO8 of the test apparatus 2 is switched to an input mode, and the strobe condition is established in order to detect the input signal shifting from the 'H' level to the 'L' level.

When the one-page-worth of writing data introduced in the buffer is written to the actual memory cell in the flash memory 1, the busy signal BUSY supplied from the multifunctional terminal DQ8/BUSY of the flash memory 1 shifts from the 'H' level to the 'L' level so that a completion of the writing is notified to the test apparatus 2. Consequently, the test apparatus 2 starts outputting writing data of the next page.

The above-described test method for the flash memory has the following problems;

(1) The input and output terminal IO8 of the test apparatus 2 needs an alternate switching operation between outputting of the writing data and inputting of the busy signal even during the writing test. Further, the writing test is immediately followed by a reading test in this test method, but a strobe condition of the reading test is different from that of the writing test. Accordingly, a test program for the test apparatus 2 becomes complicated and a programming and a debugging step therefor become time consuming, thereby prolonging a period for a development of the devices such as the flash memory 1.

(2) In a test apparatus having an ALPG (Algorithmic Pattern Generator), data with a specific pattern is output from the input and output terminal IOi and is written to a memory, and then the data which is read from the memory is compared with the specific pattern. When such test apparatus is used for the test of the flash memory 1 in a manner shown in FIG. 2A, the test apparatus can not make a correct determination because the input and output terminals IO8 receives the data DQ8 and the busy signal BUSY in a time-division manner. Accordingly, it is impossible to perform a writing operation and a reading operation consecutively in a single test.

(3) There is a test apparatus having a plurality of test circuits each compatible with a certain number of bits, e.g., 8 bits, such that the same test can be simultaneously performed for a plurality of flash memories. When such test apparatus is used to test a flash memory with 16 bits, two test circuits are necessary for a single flash memory, but the flash memory has only one multifunction terminal DQ16/BUSY. Consequently, use of merely two sets of the test circuits each having a configuration shown in FIG. 2A can not test the 16-bit flash memory.

(4) A test apparatus has a certain maximum operation frequency, and thus it is impossible to perform a high speed performance test with a frequency higher than the maximum operation frequency by means of a conventional measurement method. On the other hand, there is a test apparatus capable of performing a technique called pin-multiplex, in which two input and output terminals IOi is made to be a pair, and the clocks thereof are respectively distributed to a first half clock and a last half clock within a cycle so that a clock with pseudo doubled frequency is output. Use of such technique, however, causes such problems that the same data are always issued from the paired input and output terminals IOi, and the same decision procedures for expected values are established in the reading test. Accordingly, since only one input and output terminal IOi is not enough to monitor the busy signal BUSY, no flash memory can be tested by merely using the pin-multiplex in a manner shown in FIG. 2A.

SUMMARY OF THE INVENTION

An object of the invention is to provide an improved test method for a nonvolatile memory. The method can simplify a test program, perform writing and reading tests as a series of tests, and be compatible with a multi-bit and a pin-multiplex technique not only for common memories but also for a flash memory having a multifunctional terminal that is commonly used for inputting and outputting of data and outputting of a busy signal.

According to a first aspect of the invention, there is provided a test method by using a test apparatus for testing a nonvolatile memory including n data terminals (n denotes plural number) that are commonly used for input and output of writing data and reading data such that an n-th data terminal among the n data terminals is used to output a completion signal denoting a completion of a writing operation or an erasing operation. The test apparatus has n+1 input and output terminals. The method includes connecting n input and output terminals of the test apparatus to the n data terminals of the nonvolatile memory respectively, and connecting an n-th data terminal of the nonvolatile memory to an (n+1)-th input and output terminal of the test apparatus. The method also includes outputting writing data from the n input and output terminals of the test apparatus, and then writing the writing data to a predetermined memory area of the nonvolatile memory. The method also includes monitoring an output timing of the completion signal supplied from the nonvolatile memory after a completion of the writing by using the (n+1)-th input and output terminal of the test apparatus.

The n-th data terminal commonly used for the input and output of the data and the output of the completion signal of the nonvolatile memory is connected to not only the n-th input and output terminal of the test apparatus but also to the (n+1)-th input and output terminal of the test apparatus, such that the (n+1)-th input and output terminal is dedicated to detecting the timing of the completion signal. With this arrangement, no switching operation of the n-th input and output terminal of the test apparatus is necessary between the input and output of the data and the detection of the completion signal. Further, this arrangement allows for a simple test program and makes it possible for the writing and reading tests to be a series of tests.

According to a second aspect of the present invention, there is provided another method for testing a nonvolatile memory using another test apparatus. The test apparatus has the first and second test circuits, and each test circuit can test a memory with n bit-width. The first and second test circuits are used to test a nonvolatile memory with 2n bits. The first through the n-th data terminals of the nonvolatile memory are connected to the first test circuit, and the (n+1)-th through the 2n-th data terminal are connected to the second test circuit. Further, the 2n-th data terminal of the nonvolatile memory is connected to the (n+1)-th input and output terminals of the first and second test circuits, and the (n+1)-th input and output terminals of the first and second circuits are exclusively used as inputs so as to detect the output timing of the completion signal.

According to a third aspect of the present invention, there is provided another method for testing a nonvolatile memory using another test apparatus. The test apparatus has main and secondary pattern generators which respectively output the first and second test data at first half and the last half of the clock cycle. This test apparatus is used to test a nonvolatile memory at a clock signal faster than that of the test apparatus. Each output terminal of the main pattern generator and the corresponding output terminal of the secondary pattern generator are logically added, and then the output thereof is connected to the corresponding terminal of the nonvolatile memory. Further, the n-th data terminal of the nonvolatile memory is connected to the (n+1)-th input and output terminal of the test apparatus, and the (n+1)-th input and output terminal of the test apparatus is established as a dedicated input so as to detect the output timing of the completion signal.

The above and other objects and novel features of the present invention will be more apparent by describing preferred embodiments thereof with reference to the accompanying drawings. It should be noted that drawings are merely shown for illustration and therefore by no means limit the scope of the present invention.

DETAILED DESCRIPTION OF THE INVENTION

FIRST EMBODIMENT

Figure 1A:
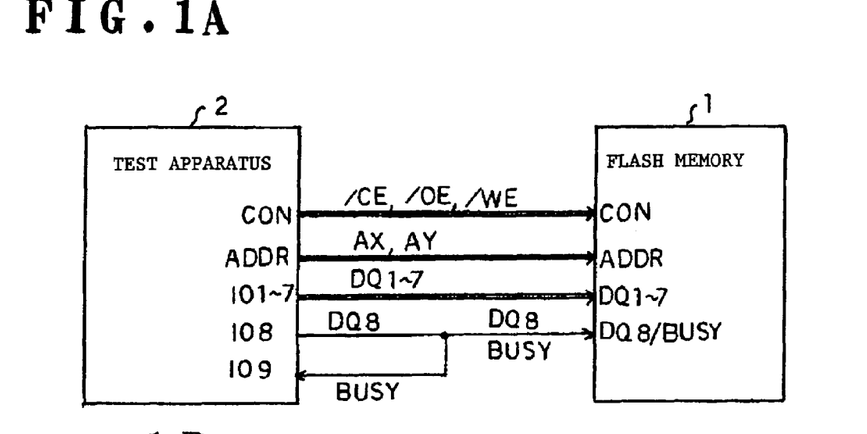
FIG. 1A is a schematic block diagram illustrating a test method for a flash memory according to a first embodiment of the present invention.
Figure 1B:
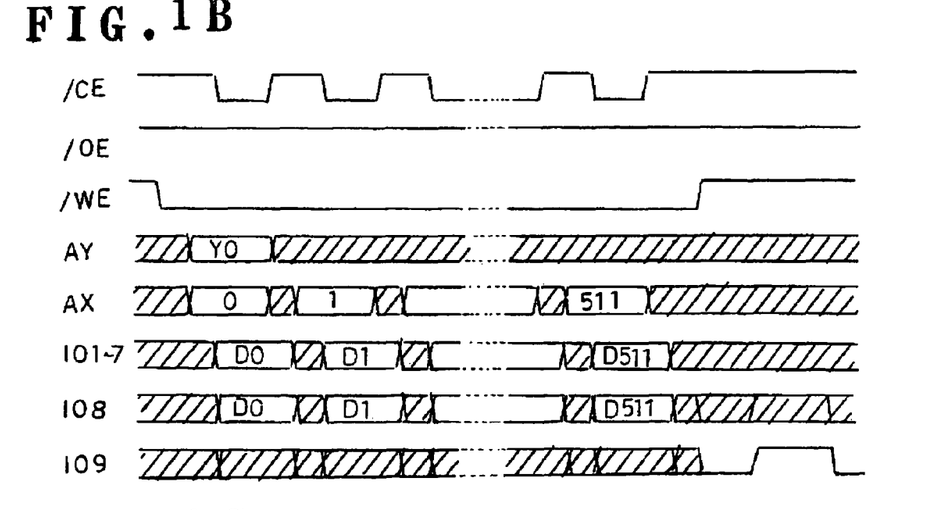
FIGS. 1B and 1C are signal waveform charts illustrating the test method for the flash memory according to a first embodiment of the present invention.
Figure 1C:
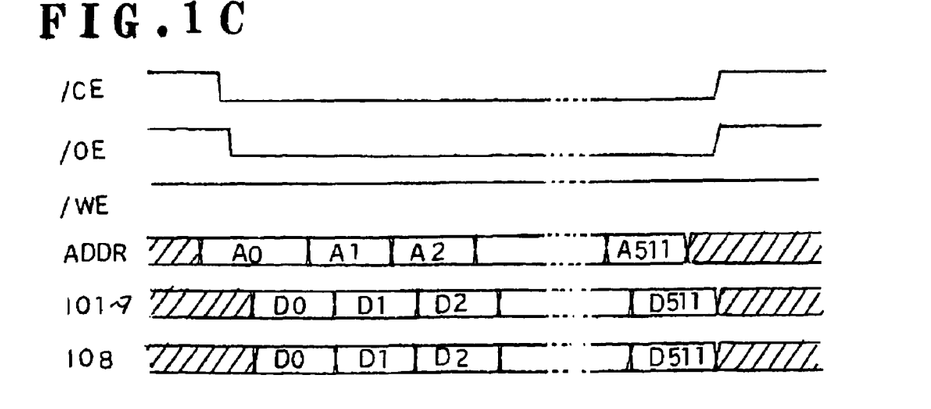

Referring to FIGS. 1A to 1C, there are shown a test method for a flash memory according to a first embodiment of the present invention. Specifically, FIG. 1A shows a block diagram of the test method, FIG. 1B shows a signal waveform chart during a writing test, and FIG. 1C shows a signal waveform chart during a reading test.

As shown in FIG. 1A, a flash memory 1 to be tested includes a control terminal section CON, an address terminal section ADDR, bidirectional data terminals DQ1-DQ7, and a multifunctional terminal DQ8/BUSY. The control terminal section CON has a plurality of terminals for receiving control signals such as a chip selection signal /CE, an output control signal /OE, and a writing control signal /WE. The address terminal section ADDR has a plurality of terminals. The number of the terminals corresponds to the number of bits of address signals, which respectively designate addresses in a memory area such that whole memory area is covered by the address signals. In this instance, a block number and a page number are designated by a higher address signal AY, while an address within the page is designated by a lower address signal AX.

The bidirectional data terminals DQ1-DQ7 respectively receive and supply data of the first through seventh bits. The multifunctional terminal DQ8/BUSY sequentially receives writing data corresponding to the eighth bit during the data writing operation. After the completion of receiving one-page-worth of writing data, the multifunctional terminal DQ8/BUSY supplies a busy signal BUSY indicating a state of non-receiving the next writing data until the completion of the writing operation to actual memory cells.

On the other hand, a test apparatus 2 includes not only the control terminal section CON and the address terminal section ADDR which are similar to those of the flash memory 1, but also a plurality of multipurpose input and output terminals IOi (i=1 to n). The control terminal section CON outputs the control signals such as the chip selection signal /CE, the output control signal /OE and the writing control signal /WE, while the address terminal section ADDR outputs the address signals AX and AY. These control signals and address signals are supplied to the flash memory 1 in accordance with a test program incorporated in the test apparatus 2. It should be noted that the control terminal section CON and the address terminal section ADDR may be configured by the multipurpose input and output terminals IOi.

The input and output terminals IOi can be switched to be either input terminals or output terminals in accordance with the test program incorporated in the test apparatus 2. When the input and output terminal IOi of the test apparatus 2 is used as input terminals for receiving data from the flash memory 1, the input and output terminal IOi establishes a strobe condition such as a load timing of the data or a rise or a fall timing of the input signal.

The control terminal section CON and the address terminal section ADDR of the test apparatus 2 are respectively connected to those of the flash memory 1 via a test device (not shown) provided therebetween. The input and output terminals IO1-IO7 of the test apparatus 2 are respectively connected to the data terminals DQ1-DQ7 of the flash memory 1. Further, the input and output terminal IO8 and the input and output terminal IO9 of the test apparatus 2 are connected to the multifunctional terminal DQ8/BUSY of the flash memory 1.

A test operation will be hereinafter described.

(A) Data Writing Test

In a writing test, the input and output terminals IO1-IO8 of the test apparatus 2 are all set to data output modes for supplying data to the flash memory 1, and the input and output terminal IO9 is set to an input mode. Further, the strobe condition of the input and output terminal IO9 is established so as to detect a fall timing of the signal.

As shown in FIG. 1B, as soon as a writing test is started, a write control signal /WE from the test apparatus 2 shifts from an 'H' level to an 'L' level. The 'L' level of the write control signal /WE remains until one-page-worth of writing data is completely output. On the other hand, the output control signal /OE to the flash memory 1 is kept at an 'H' level.

An address of the data to be written is then designated by the address signals AX and AY from the test apparatus 2. In this instance, a block number and a page number are designated by the address signal AY, while a top address, i.e., Address 0, of the page concerned is designated by the address signal AX.

Subsequent to the outputting of the address signals AX and AY, writing data D0 to be written into this address (that is AX=0) is output from the input and output terminals IO1-IO8 of the test apparatus 2. At the same time, the chip selection signal /CE from the test apparatus 2 shifts from an 'H' level to an 'L' level. Accordingly, the writing data D0 is introduced into the buffer within the flash memory 1.

When a predetermined time period elapses, the outputting of the address signals AX and AY is stopped, and the chip selection signal /CE shifts from the 'L' level to the 'H' level.

The address signal AX then designates the next address, i.e., Address 1. Subsequent to the outputting of the address signal AX, writing data D1 to be written into this address is output from the input and output terminals IO1-IO8 of the test apparatus 2. At the same time, the chip selection signal /CE from the test apparatus 2 shifts from the 'H' level to the 'L' level. Accordingly, the writing data D1 is introduced into the buffer within the flash memory 1. When a predetermined time period elapses, the outputting of the address signal AX is stopped, and the chip selection signal /CE shifts from the 'L' level to the 'H' level.

In a similar manner as describe above, the writing data are sequentially output up to the last address of the page concerned, i.e., Address 511.

The write control signal /WE having the 'H' level is then output from the control terminal section CON of the test apparatus 2, and an operation to detect a fall timing of the signal is started using the input and output terminal IO9. On the other hand, the busy signal BUSY with the 'H' level indicating that the writing operation is proceeding is output from the multifunctional terminal DQ8/BUSY of the flash memory 1.

When one-page-worth of writing data introduced in the buffer is written to the actual memory cells in the flash memory 1, the busy signal BUSY supplied from the multifunctional terminal DQ8/BUSY of the flash memory 1 shifts from the 'H' level to the 'L' level so that a completion of the writing is notified to the test apparatus 2. Consequently, the test apparatus 2 detects a fall of the busy signal BUSY by means of the input and output terminal IO9 and starts outputting writing data to the next page.

(B) Data Reading Test

After the completion of the test data writing to the flash memory 1, a data reading test is subsequently started.

In the reading test, the input and output terminals IO1-IO8 of the test apparatus 2 are all set to data input modes to receive the data to the test apparatus 2, and an operation of the input and output terminal IO9 is stopped. Further, constant strobe timings are established in the input and output terminals IO1-IO8 so as to respond to the output timing of the address signal section ADDR.

As shown in FIG. 1C, as soon as a reading test is started, an address to be initially read is designated by the address signal ADDR from the test apparatus 2. Further, the chip selection signal /CE shifts from the 'H' level to the 'L' level, and the output control signal /OE also shifts from the 'H' level to the 'L' level. These 'L' levels of the chip selection signal /CE and the output control signal /OE remain as it is until the whole data in one page are read. On the other hand, the write control signal /WE is constantly kept at the 'H' level.

In the flash memory 1, in response to the shifts of the chip selection signal /CE and the output control signal /OE to the 'L' level, data in a memory area designated by the address signal ADDR is read, and then the data is output from the data terminals DQ1-DQ7 and the multifunctional terminal DQ8/BUSY. The data read from the flash memory 1 is supplied to the test apparatus 2 via the input and output terminals IO1-IO8. In the test apparatus 2, the data on the input and output terminals IO1-IO8 is read at the constant strobe timing.

In the test apparatus 2, the address signals ADDR are sequentially changed in accordance with a predetermined sequence. Accordingly, a series of data output from the flash memory 1 in accordance with the address signal ADDR are read. After one-page-worth of data is read, the chip selection signal /CE and the output control signal /OE are returned to the 'H' level. In the test apparatus 2, the whole read data in one page is checked so as to determine whether the flash memory 1 has been correctly read and written or not.

As described above, in the test method for the flash memory according to the first embodiment, the input and output terminal IO9 of the test apparatus 2 is provided as a dedicated input terminal for the detection of the busy signal BUSY of the flash memory 1. With this arrangement, it is not necessary to switch the input and output terminal IO8 between the data output and the busy signal detection during the writing test, and therefore a structure of the test program is simplified and the time required for fabrication and debug of the test program is decreased. Accordingly, this method has an advantage to be able to shorten the development period for the devices such as flash memory 1.

Moreover, it is not necessary to change the strobe condition of the input and output terminals IO1-IO9 between the writing and reading tests, and therefore subsequent operation of the reading test can be achieved on completion of the writing test. Accordingly, this method has an advantage to be able to shorten the test period.

It should be noted that although the flash memory 1 is made to shift the busy signal BUSY from the 'H' level to the 'L' level on completion of the writing, other approaches can be alternatively employed such as a data polling method which outputs an inverted signal of the writing data during the writing operation but outputs the same signal as the writing data on completion of the writing operation, or a toggle bit method which alternately outputs the 'H' level and the 'L' level during the writing operation but outputs the same signal as the writing data on completion of the writing operation. In either method, it is necessary to provide detection means responsive to the writing completion signal.

The number of data terminals DQ in the flash memory 1 is not limited to 8, and thus any number may be available. When the number of data terminals DQ is n, the number of input and output terminals IO of the test apparatus 2 is n+1.

SECOND EMBODIMENT

Figure 3A:
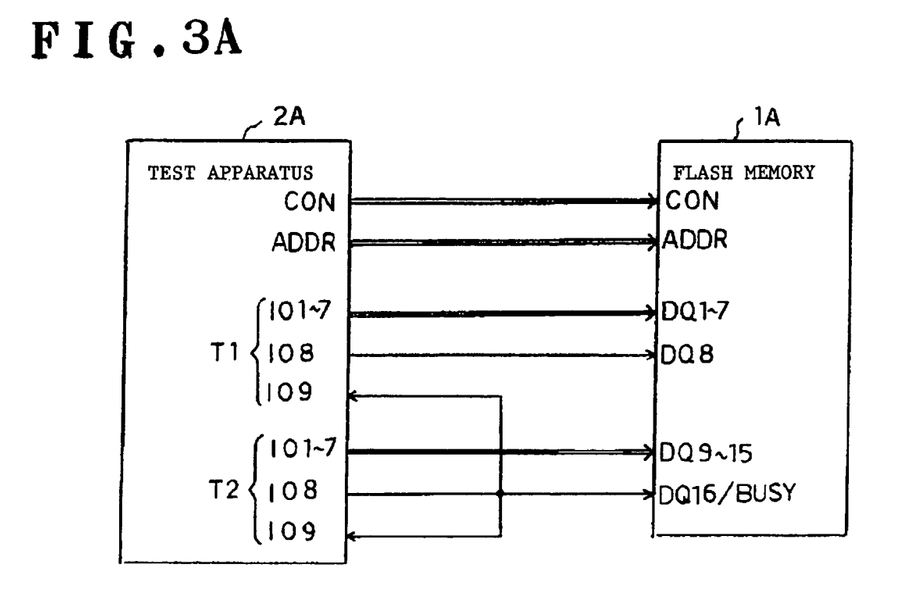
FIG. 3A is a schematic block diagram illustrating a test method for the flash memory according to a second embodiment of the present invention.
Figure 3B:
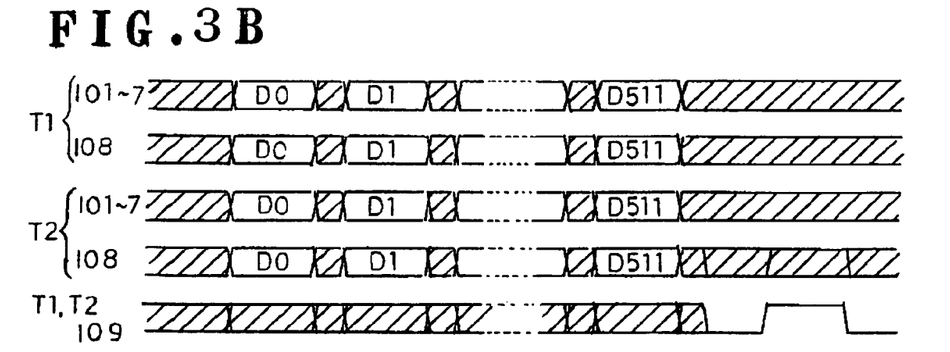
FIG. 3B is a signal waveform chart illustrating the test method for the flash memory according to the second embodiment of the present invention.

FIGS. 3A and 3B illustrate a test method for a flash memory according to a second embodiment of the present invention. Specifically, FIG. 3A is a diagram illustrating the test method, while FIG. 3B is a signal waveform chart during a writing test.

This test method employs a test apparatus 2A having two test circuits each compatible with 8 bits so that this method allows simultaneous testing of two memories each having 8 bit-width. Accordingly, this method allows testing of a flash memory 1A with 16 bits data width.

As shown in FIG. 3A, a control terminal section CON and an address terminal section ADDR of the flash memory 1A to be tested are respectively connected to those of the test apparatus 2A.

Further, data terminals DQ1-DQ7 and a data terminal DQ8 of the flash memory 1A are respectively connected to input and output terminals IO1-IO7 and an input terminal IO8 of a test circuit T1 of the test apparatus 2A. Data terminals DQ9-DQ15 of the flush memory 1A are connected to input and output terminals IO1-IO7 of another test circuit T2 of the test apparatus 2A. A multifunctional terminal DQ16/BUSY of the flash memory 1A is commonly connected to an input and output terminal IO9 of the first test circuit T1 and input and output terminals IO8 and IO9 of the second test circuit T2 of the test apparatus 2A.

A test operation will be hereinafter described.

A control signal and an address signal are omitted from FIG. 3B since these are similar to those shown in FIG. 1B.

In a writing test, the input and output terminals IO1-IO8 of the test circuits T1 and T2 of the test apparatus 2A are all designated to an output mode. On the other hand, the input and output terminals IO9 of the test circuits T1 and T2 are set to an input mode, and the strobe conditions thereof are established so as to detect a fall timing of the signal.

As soon as the writing test is started, in each address of data to be written, the data to be written is supplied from the input and output terminals IO1-IO8 of the first test circuit T1 to the data terminals DQ1-DQ8 of the flash memory 1A. At the same time, the data to be written is supplied from the input and output terminals IO1-IO8 of the second test circuit T2 to the data terminals DQ9-DQ16 of the flash memory 1A.

After the sequential outputting of the writing data up to the last address of a page to be tested, the test circuits T1 and T2 in the test apparatus 2A start monitoring the busy signal BUSY of the flash memory 1A by means of the input and output terminals IO9.

In the flash memory 1A, the busy signal BUSY with the 'H' level indicating that the writing operation is now proceeding is initially output. Once one-page-worth of writing data introduced to the buffer is written to the actual memory cells, the busy signal BUSY shifts from the 'H' level to the 'L' level, so that the completion of the writing operation is commonly notified to the test circuits T1 and T2 of the test apparatus 2A.

Accordingly, the test circuits T1 and T2 detect the fall of the busy signal BUSY by means of the respective input and output terminals IO9, and then start outputting the writing data of the next page.

As described above, in the test method for the flash memory according to the second embodiment, the input and output terminals IO9 are used as the dedicated input terminals in the test circuits T1 and T2 of the test apparatus 2A so as to detect the busy signal BUSY of the flash memory 1A. With this arrangement, in addition to the advantages similar to those of the first embodiment, this method has an advantage to be able to test a flash memory having a bit width twice as much as that of a memory that can be tested by each of the test circuits T1 and T2.

THIRD EMBODIMENT

Figure 4A:
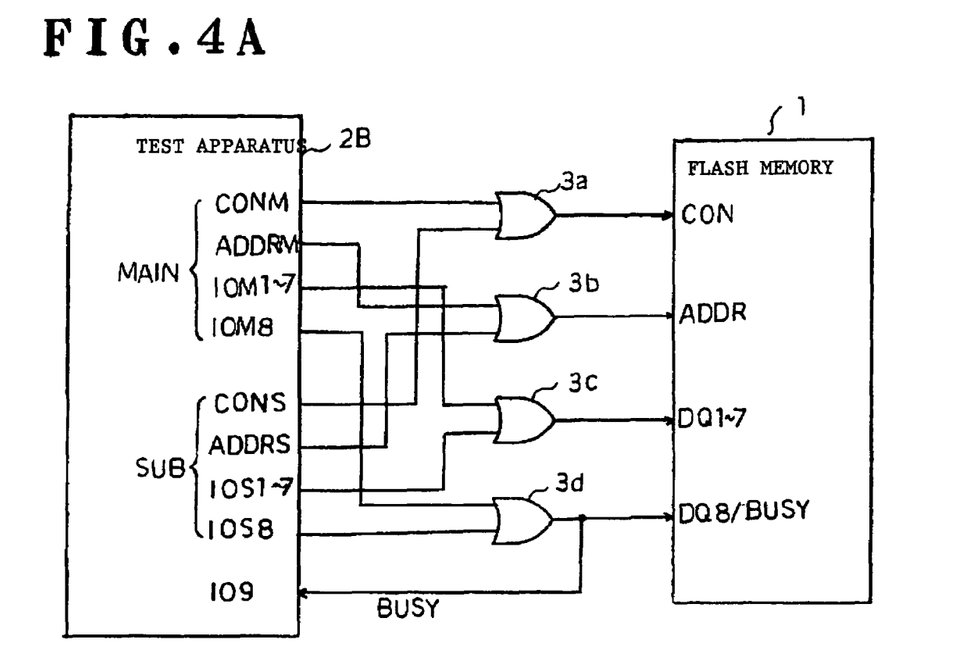
FIG. 4A is a schematic block diagram illustrating a test method for the flash memory according to a third embodiment of the present invention.
Figure 4B:
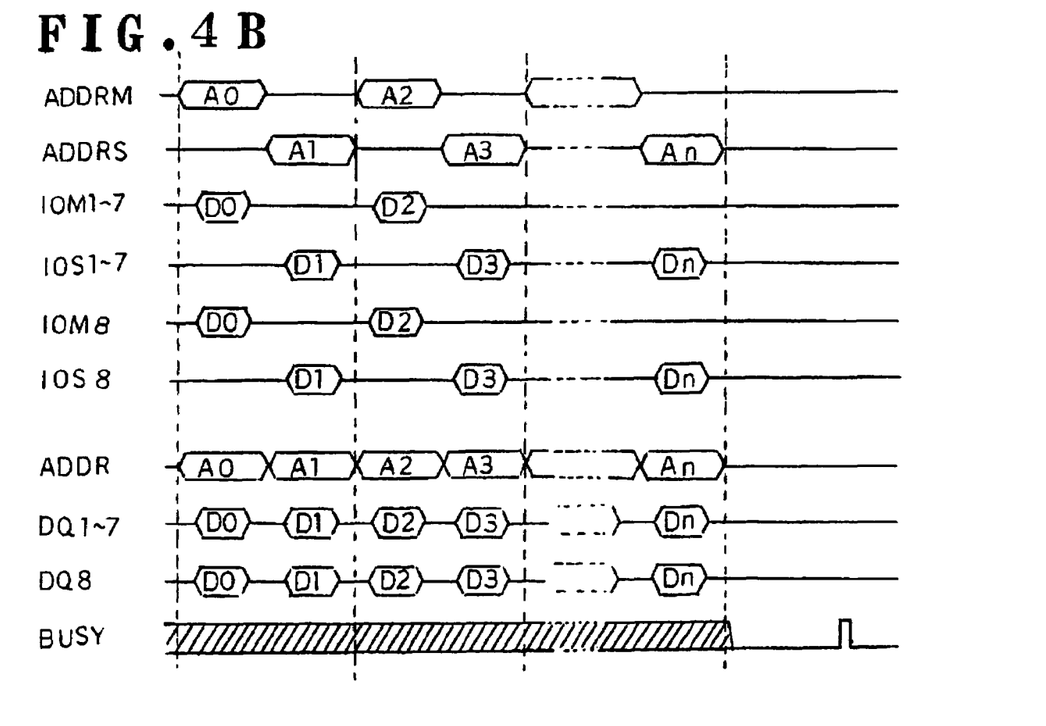
FIG. 4B is a signal waveform chart illustrating the test method for the flash memory according to the third embodiment of the present invention.

FIGS. 4A and 4B illustrate a test method for a flash memory according to a third embodiment of the present invention. Specifically, FIG. 4A is a diagram illustrating the test method, while FIG. 4B is a signal waveform chart during a writing test.

This test method employs a pin multiplex approach, in which reading and writing tests for the flash memory 1 are carried out at a rate equal to or faster than the maximum operating frequency available in a test operation of the test apparatus 2B.

The test apparatus 2B has two ALPGs, i.e., a main ALPG and a secondary ALPG. In a first half in each cycle, a test signal is output from the main ALGP, while in a last half of the cycle the test signal is output from the secondary ALPG.

As shown in FIG. 4A, a main control terminal CONM and a secondary control terminal CONS of the test apparatus 2B are connected to a control terminal CON of the flash memory 1 via a logical sum gate (hereinafter referred to as 'OR') 3a. A main address terminal ADDRM and a secondary address terminal ADDRS of the test apparatus 2B are connected to an address terminal ADDR of the flash memory 1 via an OR 3b. Further, main input and output terminals IOM1-IOM7 and secondary input and output terminals IOS1-IOS7 of the test apparatus 2B are connected to data terminals DQ1-DQ7 of the flash memory 1 via an OR 3c. A main input and output terminal IOM8 and a secondary input and output terminal IOS8 of the test apparatus 2B are connected to a multifunctional terminal DQ8/BUSY of the flash memory 1 via an OR 3d. The multifunctional terminal DQ8/BUSY is connected to an input and output terminal IO9 of the test apparatus 2B.

A test operation will be hereinafter described.

A control signal is omitted from FIG. 4B since it is similar to that shown in FIG. 1B.

In a writing test, the main input and output terminals IOM1-IOM8 and the secondary input and output terminals IOS1-IOS8 of the test apparatus 2B are all designated as data output modes to output the data from the test apparatus 2B to the flash memory 1. On the other hand, the input and output terminal IO9 of the test apparatus 2B is set to an input mode, and the strobe condition thereof is established so as to detect a fall timing of the signal.

As soon as the writing test is started, an address signal and a writing data are output from the main ALPG in a first half of each cycle, while the address signal and the writing data are output from the secondary ALPG in the last half. Accordingly, from the output sides of the OR 3a-3c, the address signals and the writing data are sequentially output in every half cycle and supplied to the flash memory 1.

After the sequential outputting of the writing data up to the last address of a page to be tested, the test apparatus 2B starts monitoring the busy signal BUSY of the flash memory 1 by means of the input and output terminal IO9.

In the flash memory 1, the busy signal BUSY with the 'H' level indicating that the writing operation is proceeding is initially output. Once one-page-worth of writing data introduced to the buffer is written to the actual memory cells, the busy signal BUSY shifts from the 'H' level to the 'L' level, so that the completion of the writing operation is notified to the test apparatus 2B. Accordingly, the test apparatus 2B detects the fall of the busy signal BUSY by means of the input and output terminal IO9, and then starts outputting the writing data of the next page.

As described above, in the test method for the flash memory according to the third embodiment, the output signals of the main and secondary ALPGs of the test apparatus 2B are logically added and supplied to the flash memory 1, and the dedicated input terminal is used to detect the busy signal BUSY of the flash memory 1. Thus, in addition to the advantages similar to those of the first embodiment, this method has a capability to test the flash memory at a rate twice as fast as the maximum clock frequency of the test apparatus 2B.

This application is based on a Japanese Patent Application No. 2004-247749 which is herein incorporated by reference.

What is claimed is:

1. A test method of using a test apparatus for testing a nonvolatile memory including n data terminals, where n is an integer greater than 1, wherein the data terminals are commonly used for input and output of writing data and reading data, wherein the nonvolatile memory is configured such that an n-th data terminal among the n data terminals is also used to output a completion signal indicating a completion of a writing operation or a completion of an erasing operation within the nonvolatile memory, the test apparatus including n+1 input and output terminals, the test method comprising:

provproviding the test apparatus;
providing the nonvolatile memory;
connecting n input and output terminals of the test apparatus to the n data terminals of the nonvolatile memory, respectively, and connecting the n-th data terminal of the nonvolatile memory to the (n-th+1) input and output terminal of the test apparatus as well as to the n-th input and output terminal of the test apparatus;
outputting writing data from the n input and output terminals of the test apparatus, and writing the writing data to a predetermined memory area of the nonvolatile memory; and
monitoring an output timing of the completion signal supplied from the nonvolatile memory after a completion of the writing of the writing data at the (n-th+1) input and output terminal of the test apparatus.

2. The test method according to claim 1, wherein the completion signal, monitored by using the (n-th+1) input and output terminal of the test apparatus, comprises a timing signal when a signal level from the n-th data terminal of the nonvolatile memory is shifted from one level to another level.

3. The test method according to claim 1, wherein the n-th data terminal of the nonvolatile memory outputs the completion signal indicating the completion of the writing operation by means of a data polling method in which an inverted signal of the writing data is issued during the writing operation but the same, signal as the writing data is issued on completion of the writing operation.

4. The test method according to claim 1, wherein the n-th data terminal of the nonvolatile memory outputs the completion signal indicating the completion of the writing operation by means of a toggle bit method in which an "H" level and an "L" level are alternately issued during the writing operation but the same signal as the writing data is issued on completion of the writing operation.

5. The test method according to claim 1, wherein the nonvolatile memory is a flash memory.

6. The test method according to claim 1, wherein the integer n is eight.

7. The test method according to claim 1, comprising monitoring the output timing of the completion signal supplied from the nonvolatile memory after a completion of the writing of the writing data only at the (n-th+1) input and output terminal of the test apparatus.

8. A test method for testing a nonvolatile memory by using a test apparatus including a first test circuit and a second test circuit that can simultaneously test two n-bit-width memories, the first test circuit having n+1 input and output terminals, the second test circuit having n+1 input and output terminals, the nonvolatile memory including 2n data terminals, where n is an integer greater than 1, wherein the data terminals are commonly used for input and output of writing data and reading data, wherein the nonvolatile memory is configured such that a 2n-th data terminal among the 2n data terminals is also used to output a completion signal indicating a completion of a writing operation or a completion of an erasing operation within the nonvolatile memory, the method comprising:

providing the test apparatus;
providing the nonvolatile memory;
connecting a first through an n-th data terminal of the nonvolatile memory to a first through an n-th input and output terminal of the first test circuit, connecting an (n-th+1) through a 2n-th data terminal of the nonvolatile memory to a first through an n-th input and output terminal of the second test circuit, and connecting a 2n-th data terminal of the nonvolatile memory to an (n-th+1) input and output terminal of the first test circuit and to an (n-th+1) input and output terminal of the second test circuit as well as to the n-th input and output terminal of the second test circuit;
outputting writing data from the first to the n-th input and output terminals of the first and second test circuits, and writing the writing data to a predetermined memory area of the nonvolatile memory; and
monitoring an output timing of the completion signal supplied from the nonvolatile memory after a completion of the writing at the (n-th+1) input and output terminals of the first and second test circuits.

9. The test method according to claim 8, wherein the completion signal, monitored by using the (n-th+1) input and output terminal of the test apparatus, comprises a timing signal when a signal level from the n-th data terminal of the nonvolatile memory is shifted from one level to another level.

10. The test method according to claim 8, wherein the n-th data terminal of the nonvolatile memory outputs the completion signal indicating the completion of the writing operation by means of a data polling method in which an inverted signal of the writing data is issued during the writing operation but the same signal as the writing data is issued on completion of the writing operation.

11. The test method according to claim 8, wherein the n-th data terminal of the nonvolatile memory outputs the completion signal indicating the completion of the writing operation by means of a toggle bit method in which an 'H' level and an 'L' level are alternately issued during the writing operation but the same signal as the writing data is issued on completion of the writing operation.

12. The test method according to claim 8, wherein the nonvolatile memory is a flash memory.

13. The test method according to claim 8, wherein the integer n is eight.

14. The test method according to claim 8, comprising monitoring the output timing of the completion signal supplied from the nonvolatile memory after a completion of the writing only at the (n-th+1) input and output terminals of the first and second test circuits.

15. A test method for testing a nonvolatile memory by using a test apparatus including a main pattern generator for outputting first test data at a first half of each clock cycle and a secondary pattern generator for outputting second test data at a last half of the each clock cycle, the nonvolatile memory including n data terminals, where n is an integer greater than 1, wherein the data terminals are commonly used for input and output of writing data and reading data, wherein the nonvolatile memory is configured such that an n-th data terminal among the n data terminals is also used to output a completion signal indicating a completion of a writing operation or a completion of a an erasing operation within the nonvolatile memory, the method comprising:

providing the test apparatus;
providing the nonvolatile memory;
logically adding output terminals of the main pattern generator with output terminals of the secondary pattern generator, respectively, and connecting logically added output terminals with terminals of the nonvolatile memory, and connecting an n-th data terminal of the nonvolatile memory with an (n-th+1) input and output terminal of the test apparatus, as well as to the logically added output terminals;

alternately outputting writing data from the main pattern generator and the secondary pattern generator, and writing the writing data to a predetermined memory area of the nonvolatile memory; and monitoring an output timing of the completion signal supplied from the nonvolatile memory after a completion of the writing by using the (n-th+1) input and output terminal of the test apparatus.

16. The test method according to claim 15, wherein the completion signal, monitored by using the (n-th+1) input and output terminal of the test apparatus, comprises a timing signal when a signal level from the n-th data terminal of the nonvolatile memory is shifted from one level to another level.

17. The test method according to claim 15, wherein the n-th data terminal of the nonvolatile memory outputs the completion signal indicating the completion of the writing operation by means of a data polling method in which an inverted signal of the writing data is issued during the writing operation but the same signal as the writing data is issued on completion of the writing operation.

18. The test method according to claim 15, wherein the n-th data terminal of the nonvolatile memory outputs the completion signal indicating the completion of the writing operation by means of a toggle bit method in which an 'H' level and an 'L' level are alternately issued during the writing operation but the same signal as the writing data is issued on completion of the writing operation.

19. The test method according to claim 15, wherein the nonvolatile memory is a flash memory.

20. The test method according to claim 15, wherein the integer n is eight.

21. The test method according to claim 15, comprising monitoring the output timing of the completion signal supplied from the nonvolatile memory after the completion of the writing by using only at the (n-th+1) input and output terminal of the test apparatus.

* * * * *